(12) United States Patent
Berggren

(10) Patent No.: US 8,284,757 B2
(45) Date of Patent: Oct. 9, 2012

(54) ENCODING AND DETECTING CELL-SPECIFIC INFORMATION IN A TELECOMMUNICATION SYSTEM

(75) Inventor: Fredrik Berggren, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/331,504

(22) Filed: Dec. 20, 2011

(65) Prior Publication Data

US 2012/0087365 A1 Apr. 12, 2012

Related U.S. Application Data

(63) Continuation of application No. 12/342,461, filed on Dec. 23, 2008, which is a continuation of application No. PCT/CN2006/002526, filed on Sep. 25, 2006.

(51) Int. Cl.
*H04W 56/00* (2009.01)
(52) U.S. Cl. ........ 370/350; 370/320; 370/335; 370/342; 370/441; 455/422.1
(58) Field of Classification Search .................. 370/320, 370/335, 342, 350, 441; 455/422.1; 375/145, 375/365, 340; 714/775, 782, 789
See application file for complete search history.

(56) References Cited

U.S. PATENT DOCUMENTS

| | | | | |
|---|---|---|---|---|
| 6,504,830 | B1* | 1/2003 | Östberg et al. | 370/342 |
| 6,731,673 | B1* | 5/2004 | Kotov et al. | 375/145 |
| 6,754,251 | B1* | 6/2004 | Sriram et al. | 375/145 |
| 6,891,882 | B1 | 5/2005 | Hosur et al. | |
| 7,126,981 | B2* | 10/2006 | Ho et al. | 375/147 |
| 7,236,468 | B2* | 6/2007 | Ryu et al. | 370/320 |
| 7,633,976 | B2* | 12/2009 | Shieh et al. | 370/513 |
| 7,848,438 | B2* | 12/2010 | Baum et al. | 375/260 |
| 7,965,761 | B2 | 6/2011 | Shattil | |
| 2002/0057664 | A1 | 5/2002 | Sarkar | |
| 2003/0007476 | A1 | 1/2003 | Kim et al. | |
| 2003/0128657 | A1 | 7/2003 | Kuroyanagi et al. | |
| 2004/0160934 | A1* | 8/2004 | Back | 370/342 |

(Continued)

FOREIGN PATENT DOCUMENTS

CN 1395387 A 2/2003

(Continued)

OTHER PUBLICATIONS

International search report for International application No. PCT/CN2006/002526, dated Jul. 5, 2007, total 2 pages.

(Continued)

*Primary Examiner* — Chi Pham
*Assistant Examiner* — Ahmed Elallam

(57) ABSTRACT

Method and apparatus are provided for encoding cell-specific information in a telecommunication system. Cell-specific information is encoded by a synchronization code. A synchronization signal including the synchronization code is sent, wherein the synchronization code includes a first repetitive cyclically permutable codeword generated from a first codeword $(c_1, c_2, \ldots c_i \ldots, c_{\lceil \frac{M}{2} \rceil})$, where $\lceil \frac{M}{2} \rceil$ is the smallest integer not less than M/2, $0 \leq c_i \leq N$, $1 \leq i \leq M$ for all i, M, N are positive integers, and the repetitive structure of the first repetitive cyclically permutable codeword is given by repeating the value of at least one codeword element of the first repetitive cyclically permutable codeword in at least one other codeword element position within the first repetitive cyclically permutable codeword.

20 Claims, 2 Drawing Sheets

U.S. PATENT DOCUMENTS

2005/0111522 A1    5/2005   Sung et al.
2005/0153695 A1*   7/2005   Cho .............................. 455/436
2006/0028976 A1    2/2006   Park et al.

FOREIGN PATENT DOCUMENTS

CN        1395772 A       2/2003
WO      2007082408 A1     7/2007

OTHER PUBLICATIONS

English Translation of the Written Opinion of the International Search Authority for International application No. PCT/CN2006/002526, total 3 pages.

Sriram et al., "Cyclically Permutable Codes for Rapid Acquisition in DS-CDMA Systems with Asynchronous Base Station," IEEE Journal on Selected Areas in Communications, vol. 19, No. 1, Jan. 2001, total 12 pages.

Chinese office action for Chinese application No. 200680038917.4, dated Apr. 3, 2009, and an English translation thereof, total 8 pages.

3rd Generation Partnership Project; Technical Specification Group Radio Access Network; Spreading and modulation (FDD) (Release 6), 3GPP TS 25.213 V6.4.0, Sep. 2005, total 32 pages.

Etri, "Cell Search Scheme for EUTRA," 3GPP RAN WG1 #44 bis Meeting, R1-060823, Mar. 27-31, 2006, total 14 pages.

Huawei, "Cell search times of hierarchical and non-hierarchical SCH signals," 3GPP TSG RAN WG1#45, R1-061248, May 8-12, 2006, total 5 pages.

Huawei, "Additional link-level evaluations of cell search times for non-hierarchical and hierarchical SCH signals," 3GPP TSG RAN WG1 LTE AdHoc, R1-061817, Jun. 27-30, 2006, total 6 pages.

Huawei, "System-level evaluation of cell search times for non-hierarchical and hierarchical SCH signals," TSG RAN WG1 ad hoc meeting, R1-061818, Jun. 27-30, 2006, total 6 pages.

Schmidl et al. "Robust Frequency and Timing Synchronization for OFDM," IEEE Transaction on Communications, vol. 45, No. 12, Dec. 1997, total 9 pages.

Tanda, "Blind Symbol-Timing and Frequency-Offset Estimation in OFDM Systems with Real Data Symbols," IEEE Transactions on Communications, vol. 52, No. 10, Oct. 2004, total 4 pages.

Wang et al., "Cell Search in W-CDMA," IEEE Journey on Selected Areas in Communications, vol. 18, No. 8, Aug. 2000, total 13 pages.

First office action issued in corresponding U.S. Appl. No. 12/342,461, dated Jun. 19, 2012, 9 pages total.

* cited by examiner

ENCODING AND DETECTING CELL-SPECIFIC INFORMATION IN A TELECOMMUNICATION SYSTEM

CROSS-REFERENCE TO RELATED APPLICATIONS

This application is a continuation of U.S. patent application Ser. No. 12/342,461, filed on Dec. 23, 2008, which is a continuation of International Patent Application No. PCT/CN2006/002526, filed on Sep. 25, 2006, which is hereby incorporated by reference in its entirety.

FIELD OF THE INVENTION

The present invention relates to communication, and more particularly, to a method and apparatus for encoding and detecting data and synchronization information in a telecommunication system.

BACKGROUND OF THE INVENTION

In a cellular mobile communications system, "cell search" is the procedure by which the user equipment (UE) achieves time and frequency synchronization with a cell and detects its cell ID. The UE is time synchronized when start of the symbols as well as the radio frame is found. Both symbol timing and frame timing need to be found for completing the cell search.

To improve the symbol timing performance, the synchronization signals are envisaged to be multiplexed several times per radio frame. For example, in WCDMA (Wideband Code Division Multiple Access), the synchronization channel (SCH) is transmitted 15 times per 10 ms radio frame. Output statistics from the correlator performing the symbol timing acquisition can be accumulated, which improves the probability of correct symbol timing. Furthermore, to allow efficient handover between different radio systems, it is anticipated that the synchronization channel is multiplexed frequently in a radio frame. However, a consequence of such multiple instances of multiplexing the SCH signals within a frame is that frame timing does not follow directly from symbol timing. Mechanisms are therefore needed that, given the symbol timing, can determine the frame timing.

Two classes of SCH to be used in the cell search can be defined: a non-hierarchical SCH and a hierarchical SCH. The non-hierarchical SCH contains cell-specific signals that serve both for the complete timing and frequency acquisition and cell ID detection. The hierarchical SCH consists of at least two signals; a known primary cell-common signal used only for symbol timing acquisition, and other cell-specific signals used for frame timing, frequency synchronization and cell ID detection.

A previously used concept for frame timing in hierarchical cell search, shown in reference documents [1], [2], and [3], which are identified in the list at the end of this specification, includes transmission of different signals in the SCH slots within a frame, and are incorporated herein by reference. Given the symbol timing, the signals in the SCH slots are detected independently, but together they represent elements of a codeword from a synchronization code. Since the SCH is periodically transmitted, the receiver can detect any cyclic version of a codeword. The code must therefore be constructed so that all cyclic shifts of a codeword are unique and no codeword is a cyclic shift of another codeword. Thereby the frame timing can be uniquely determined from the cyclic shift of the detected codeword.

In WCDMA there are 512 scrambling codes (cell IDs), which are grouped into 64 scrambling code groups including 8 codes each. Each of the 64 code groups is represented by a codeword. For detecting the frame timing, the soft decision maximum likelihood principle includes computation of decoding metrics for the codewords and all their cyclic shifts. Thus an advantage of this hierarchical solution is that it reduces the search for frame timing to the decoding of 64 codewords, i.e., reduction to much less codewords than the number of cell IDs is done.

However, in a fully non-hierarchical SCH, it is foreseen that the cell ID and frame synchronization are detected only from the SCH signals within the frame, i.e., no use of hierarchical cell ID grouping or other channels should be needed. Correspondingly, in a non-hierarchical solution, one would need to decode and compute metrics for 512 codewords (cell IDs) and their cyclic shifts at once. Since the cell ID detection is done both initially for finding the home cell and continuously for supporting mobility by finding neighbor cells, such an exhaustive procedure may become overly tedious, use considerable computing and power resources in the UE and prolong the cell search time. Moreover, as has been discussed for the E-UTRA system, not only cell IDs but also additional cell-specific information may be included in the cell search procedure, e.g., channel bandwidth, number of antennas- and cyclic prefix lengths. This would require even larger sets of codewords that need to be efficiently decoded.

Therefore, in particular for non-hierarchical SCHs and/or cases where considerable cell-specific information should be included in the cell search, novel code designs and methods to detect the frame timing are required. It is desirable to give the codewords some form of structure that can be utilized by the receiver. There is a need for achieving performance close to the maximum likelihood decoder, while keeping low decoding complexity by employing some form of systematic decoding algorithm, tailored to the structure of the code.

A synchronization code should be designed that is able to carry cell-specific information and have a structure for frame timing synchronization. Several different synchronization signals are assumed to be multiplexed into a radio frame, and the allocation of these signals to the frame (i.e., the codeword design) should be done so that it allows for efficient systematic decoding and performance comparable to maximum likelihood decoding.

SUMMARY OF THE INVENTION

Methods and apparatus are provided that to encode and to detect data and synchronization information in a telecommunication system in a manner that reduces complexity compared to existing practices. Embodiments provide apparatus and a method operable to encode data and synchronization information in a telecommunication system with a code, the code being created by choosing codewords $(\tilde{c}_1, \tilde{c}_2, \ldots, \tilde{c}_M)$ of length M so that no codeword is a cyclic shift of another codeword and each codeword has M distinct unique cyclic shifts, M being a positive integer.

The present invention also provides a methods and apparatus for detecting data and synchronization information in a telecommunication system. Embodiments provide a method and apparatus for detecting data and synchronization information in a telecommunication system encoded by a code having codewords $(\tilde{c}_1, \tilde{c}_2, \ldots, \tilde{c}_M)$ of length M, none of said codewords being a cyclic shift of another codeword and each codeword having M distinct unique cyclic shifts and a repetitive structure, M being a positive integer.

The present invention also provides a base station in a telecommunication system, such as a base station operable to encode data and synchronization information with a code having codewords $(\tilde{c}_1, \tilde{c}_2, \ldots, \tilde{c}_M)$ of length M so that no codeword is a cyclic shift of another codeword and each codeword has M distinct unique cyclic shifts, M being a positive integer.

A mobile station is also provided that is operable to detect data and synchronization information encoded by a code having codewords $(\tilde{c}_1, \tilde{c}_2, \ldots, \tilde{c}_M)$ of length M, none of said codewords being a cyclic shift of another codeword and each codeword having M distinct unique cyclic shifts and a repetitive structure, M being a positive integer.

Reduced complexity is achieved by creating a code in which there is repeated, in each codeword, the value of at least one codeword element $\tilde{c}_k$ of the codeword in at least one other codeword element position within the same codeword, thereby giving all codewords in the code a repetitive structure.

Reduced complexity is also achieved by detecting the codewords of the code by:

evaluating, by use of hypotheses Hx, the repetitive codeword structure of received codewords and choosing a hypothesis corresponding to the repetitive codeword structure, diversity combining codeword elements of the codewords in accordance with the chosen hypothesis, and detecting the received codewords by comparing the diversity combined codeword elements to possible codewords fulfilling the hypothesis The invention presents a solution that gives a performance very close to pure maximum likelihood detection, which is an optimal detection, but with much lower decoding complexity.

The invention presents a number of methods for creating codes having a repetitive structure. These different code creation methods can be useful under different circumstances and in different systems. The common advantageous inventive feature of all of these codes is that they all have a repetitive structure that can be used to simplify the decoding procedure at the receiver.

Detailed exemplary embodiments and advantages of the code creation methods, decoding methods and apparatus according to the invention will now be described with reference to the appended drawings illustrating some preferred embodiments.

DETAILED DESCRIPTION OF THE EMBODIMENTS

Figure 1:
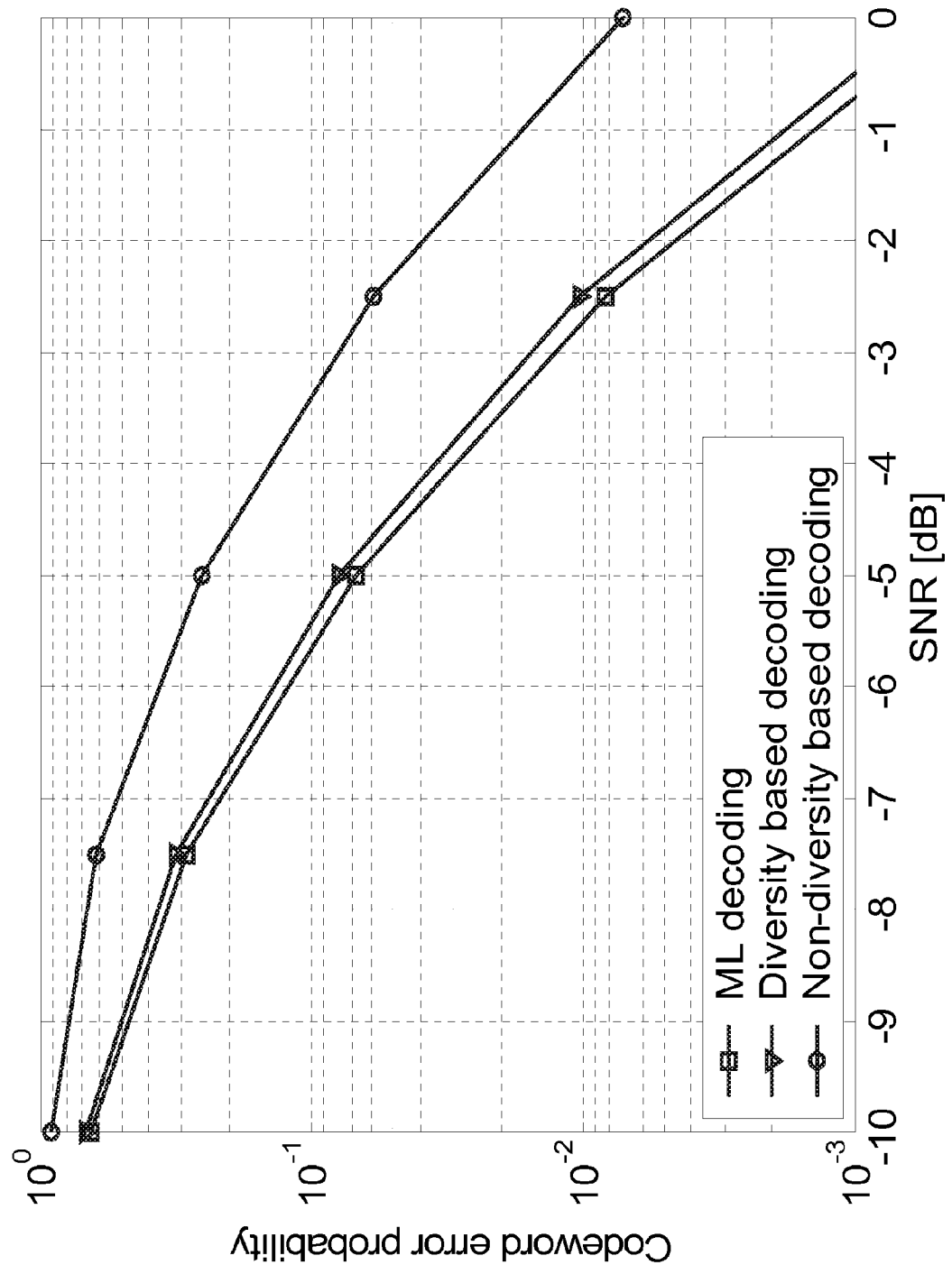
FIG. 1 shows performance simulations for the method of the present invention and for two conventional methods.

Embodiments of the invention are described in detail below and will be further understood when the following text is read in conjunction with the accompanying drawing figures, in which similar items are designated by similar reference characters.

In cell search, the first step is symbol synchronization. The symbol timing in the non-hierarchical SCH is typically obtained by auto-correlation methods of the received signal, taking certain properties of the synchronization signal into account. Both symmetric and periodic signals have been suggested in the background art, see reference documents [4] and [5] for symmetric signals and reference document [6] for periodic signals. In a hierarchical method, the symbol timing can be obtained by correlation with a replica of the transmitted primary synchronization channel (P-SCH). Usually there is also some form of frequency synchronization. Once symbol timing and frequency synchronization is found, frame timing synchronization and cell ID detection may begin. Symbol and frequency synchronization are outside the scope of this invention and are assumed to be performed in the system.

In WCDMA, the secondary SCH (S-SCH) is transmitted in 15 slots per radio frame. In each such slot, 1 out of 16 S-SCH sequences can be used. These 15 slots are interpreted as the elements of a code word with the S-SCH sequence allocations taken from a Reed-Solomon code. In total there are 64 S-SCH codewords of length 15. These codewords and all their cyclic shifts are designed to be unique. For decoding a codeword, the receiver computes a soft decoding metric for all codewords and all their cyclic shifts, i.e., in total 64*15 metrics, as is shown in reference document [3]. Thereby, frame timing is directly obtained once the S-SCH is correctly decoded. The codewords also correspond to the scrambling code groups. Finally, the cell ID is determined from exhaustive test of all scrambling codes in the detected scrambling code group, using the common pilot channel (CPICH).

In reference document [7], the comma-free code concept has been adopted to non-hierarchical SCH. Different periodic signals, which are used both for finding symbol timing and cell ID, are transmitted in 5 slots within the radio frame. Albeit the signals may be different, they all have the same time-domain property (periodicity). Hence, different periodic signals may be multiplexed into the radio frame without loss of averaging gain for the symbol timing. The same conclusion also holds if the synchronization signals are symmetric. A code is given that comprises 236 codewords, requiring 236*5 metric computations for decoding. As for the hierarchical scheme, the correct decoding of a codeword gives the cell ID and the frame timing. Another code, found by exhaustive search to give 512 codewords of length 4, is used in the non-hierarchical scheme shown in reference document [8] .The decoding is here done by the maximum likelihood principle.

Thus the above described background art solutions all rely on the maximum likelihood soft decoding principle, not using any particular structure of the code as basis for decoding.

The present invention aims to present a synchronization code and associated method for detecting frame timing synchronization and cell-specific information. The synchronization signal comprises M SCH sequences/symbols being transmitted per radio frame. The allocation of SCH sequences to the M slots is performed in accordance with the code of the present invention, which has a repetitive structure that provides means for efficient decoding.

For M SCH symbols per radio frame and N different possible SCH sequences/symbols, a repetitive cyclically permutable code construction is, according to the invention, proposed to have the following characteristics:

The code should be a cyclically permutable code of length M from an alphabet N so that no codeword is a cyclic shift of another and each codeword has M distinct cyclic shifts. Codes like this are known from, for instance, reference document [3].

The code should further have a repetitive structure so that at least one codeword element appears at least two times within the same codeword. This repetitive structure must be followed in each codeword of the code. This is a new feature, proposed by the present invention.

By adding the proposed repetitive structure to the codewords, a decoding method can be deduced for which a low number of decoding metrics need to be computed for detection of the frame synchronization.

The repetitive structure of the codewords affords diversity combining and the associated decoding method utilizes the repetitive structure in the code to obtain frame synchronization and cell ID. The decoding method according to the invention has the following characteristics:

- For each of the M SCH slots in the frame, a metric is computed for each of the N SCH sequences (e.g. obtained from correlation with all candidate sequences) which relates to the probability that the sequence was transmitted. This is also done in background art decoding methods.
- A set of hypotheses is tested, exploiting the computed metrics and the repetitive structure of the codewords, and one hypothesis that best fits the structure of the codeword is selected. This selected hypothesis determines which of the M received codeword elements that can be diversity combined. This part of the decoding method, proposed by the present invention, is new compared to background art decoding methods.
- Diversity combining (summation) of the repeated symbols' metrics is performed, using information relating to the selected hypothesis. This is also a new feature.
- Cell ID and final frame synchronization are found from codewords, detected by selecting, for each slot, the sequence with the largest diversity combined metric. This is also a new feature.

For an exemplary embodiment of the invention, this decoding method can, compared to maximum likelihood decoding, reduce the decoding complexity a factor MW/N for even M, and a factor 2W/N for odd M, where M is the codeword length, N is the number of candidate SCH sequences/symbols and W is the number of codewords.

For a given M and N, the decoding complexity and detection performance of the method according to the invention are, for the method steps of hypothesis testing, diversity combining and codeword detection, independent of the number of codewords in the code. This is in contrast to a maximum likelihood decoder, for which the decoding complexity grows with the number of codewords and, at the same time, the decoding performance gets worse.

Provided below is a more detailed description of the present invention. Exemplary embodiments illustrate how the code is created by describing how codewords are generated, and thereafter the decoding procedure is described.

Code Construction

A cyclically permutable code of length M is defined as having the property that no code word is a cyclic shift of another, and each codeword has M distinct cyclic shifts. Such a code can uniquely encode frame timing, since all codewords and all cyclic shifts of the codewords are unique, and is thus very suitable to use for synchronization.

Now it is assumed that $$\left(c_1, c_2, \ldots c_i \ldots, c_{\lceil \frac{M}{2} \rceil}\right)$$

is a codeword from a cyclically permutable code, such as the code in reference document [3] or any other suitable code, of length $$\left\lceil \frac{M}{2} \right\rceil, \text{ where } \left\lceil \frac{M}{2} \right\rceil$$

is the smallest integer not less than M/2. It is supposed $1 \leq c_i \leq N$ for all i, N is thus the alphabet (the number of possible SCH sequences/symbols) that can be used in each element of the codewords.

A first repetitive cyclically permutable (RCP) code ($\tilde{c}_1, \tilde{c}_2, \ldots, \tilde{c}_M$) according to the invention can then be constructed by:

for M even:

$$\tilde{c}_{2k-1} = \tilde{c}_{2k} = c_k, \ k=1, 2, \ldots, M/2,$$

and for M odd:

$$\tilde{c}_{2k-1} = \tilde{c}_{2k} = c_k,$$
$$k = 1, 2, \ldots, \left\lceil \frac{M}{2} \right\rceil - 1,$$
$$\tilde{c}_M = c_{\lceil \frac{M}{2} \rceil}.$$

The foregoing process provides a repetitive cyclically permutable code. The created repetitive code is cyclically permutable, and thus fulfils the basic requirement for application to frame timing detection. The codewords ($\tilde{c}_1, \tilde{c}_2, \ldots, \tilde{c}_M$) constitute a cyclically permutable code, as demonstrated in the following text.

Start of Proof.

First, let M be even and consider a codeword $$(\tilde{c}_1, \tilde{c}_2, \ldots, \tilde{c}_M) = \left(c_1, c_1, c_2, c_2, \ldots, c_{\frac{M}{2}}, c_{\frac{M}{2}}\right).$$

For the one-step cyclically shifted codeword $$\left(c_{\frac{M}{2}}, c_1, c_1, c_2, \ldots, c_{\frac{M}{2}}\right)$$

to be equal to the non-shifted codeword, $$c_1 = c_2 = \ldots = c_{\frac{M}{2}}$$

must be satisfied, which is impossible, since the M/2 symbols long codeword $$\left(c_1, c_2, \ldots, c_{\frac{M}{2}}\right)$$

is cyclically permutable by assumption. Proceeding in the same manner, for every cyclic shift, the same criteria follows $$c_1 = c_2 = \ldots = c_{\frac{M}{2}}.$$

It is straightforward to see that the same condition appears when M is odd. Hence the codeword ($\tilde{c}_1, \tilde{c}_2, \ldots, \tilde{c}_M$) has M distinct shifts.

Since all the original M/2 symbols long codewords are unique by assumption, and the mapping to the M symbols long codewords is one-to-one, the codewords must also be unique. Therefore, each codeword is unique and has M distinct shifts.

Consider further another codeword $$(\tilde{b}_1, \tilde{b}_2, \ldots, \tilde{b}_M) = \left(b_1, b_1, b_2, b_2, \ldots, b_{\frac{M}{2}}, b_{\frac{M}{2}}\right),$$

for which we showed above that $(\tilde{b}) \neq (\tilde{c})$. For the one-step cyclically shifted codeword to be equal to another codeword, we must have $$\left(b_{\frac{M}{2}}, b_1, b_1, b_2, \ldots, b_{\frac{M}{2}}\right) = \left(c_1, c_1, c_2, c_2, \ldots, c_{\frac{M}{2}}\right),$$

which results in that $$b_1 = b_2 = \ldots = b_{\frac{M}{2}},$$

which is impossible. Therefore, any cyclic shift of a codeword is not another codeword. Hence, the RCP is a cyclically permutable code.

End of proof.

The first repetitive code created according to this embodiment of the invention is thus a cyclically permutable code and is therefore suitable for frame timing synchronization.

A second repetitive cyclically permutable (RCP) code $(\tilde{c}_1, \tilde{c}_2, \ldots, \tilde{c}_M)$ according to the invention can for odd M be constructed by:

$$\tilde{c}_k = \begin{cases} c_k & k = 1, 2, \ldots, \lceil \frac{M}{2} \rceil \\ c_{M+1-k} & k = \lceil \frac{M}{2} \rceil + 1, \ldots, M \end{cases}$$

We have here created a second repetitive cyclically permutable code. We will now show that the codewords, $(\tilde{c}_1, \tilde{c}_2, \ldots \tilde{c}_M)$ of this second code constitute a cyclically permutable code by the following proof.

Start of Proof.

Consider a codeword $$(\tilde{c}_1, \tilde{c}_2, \ldots, \tilde{c}_M) = \left(c_1, c_2, \ldots, c_{\lceil \frac{M}{2} \rceil}, c_{\lceil \frac{M}{2} \rceil - 1}, \ldots, c_1\right).$$

For the one-step cyclically shifted codeword $(c_1, c_1, c_2, \ldots, c_3, c_2)$ to be equal to the non-shifted codeword, we must have $$c_1 = c_2 = \ldots = c_{\lceil \frac{M}{2} \rceil},$$

which is impossible, since the $$\lceil \frac{M}{2} \rceil$$

symbols long codeword $$\left(c_1, c_2, \ldots, c_{\lceil \frac{M}{2} \rceil}\right)$$

is cyclically permutable by assumption. Proceeding in the same manner, for every cyclic shift, the same criteria follows $$c_1 = c_2 = \ldots = c_{\lceil \frac{M}{2} \rceil}.$$

Hence the codeword $(\tilde{c}_1, \tilde{c}_2, \ldots, \tilde{c}_M)$ has M distinct shifts.

Since all the original $$\lceil \frac{M}{2} \rceil$$

symbols long codewords are unique by assumption, and the mapping to the M symbols long codewords is one-to-one, the codewords must also be unique. Therefore, each codeword is unique and has M distinct shifts.

Consider another codeword $$(\tilde{b}_1, \tilde{b}_2, \ldots, \tilde{b}_M) = \left(b_1, b_2, \ldots, b_{\lceil \frac{M}{2} \rceil}, b_{\lceil \frac{M}{2} \rceil - 1}, \ldots, b_1\right),$$

for which we showed above that $(\tilde{b}) \neq (\tilde{c})$. For the one-step cyclically shifted codeword to be equal to another codeword, we must have $$(b_1, b_1, b_2, \ldots, b_3, b_2) = \left(c_1, c_2, \ldots, c_{\lceil \frac{M}{2} \rceil}, c_{\lceil \frac{M}{2} \rceil - 1}, \ldots, c_1\right),$$

which results in that $$c_1 = c_2 = \ldots = c_{\lceil \frac{M}{2} \rceil},$$

which is impossible. Therefore, any cyclic shift of a codeword is not another codeword. Hence, it is a cyclically permutable code.

End of Proof.

The second repetitive code created according to the invention is thus also a cyclically permutable code and is therefore suitable for frame timing synchronization.

The construction of a repetitive cyclically permutable (RCP) code according to the invention assumes a cyclically permutable code to start with. Such codes can be generated in a number of ways as is clear for a skilled person. Hereafter two such exemplary ways are described.

One way of generating cyclically permutable codes in a systematic and simple fashion could be the following. Suppose that N=64 and M=4. A cyclically permutable code of length 2 can, e.g., be found by the set of code words {($c_1,c_2$): (1,2), (1,3), ..., (1,64), (2,3), (2,4), ..., (2,64), (3,4), ..., (3,64), ...}. In total there are at most 63+62+61+...+1=2016 codewords.

A repetitive cyclically permutable (RCP) code according to the invention can be constructed by having these sets of codewords {($c_1$, $c_2$): (1,2), (1,3), ..., (1,64), (2,3), (2,4), ..., (2,64), (3,4), ..., (3,64), ...} as a starting point. Following the RCP code construction for even value M given above, $\tilde{c}_{2k-1}=\tilde{c}_{2k}=c_k$, k=1, 2, ..., M/2, the new set of extended codewords according to the invention is; {(1,1,2,2), (1,1,3,3), ..., (1,1,64,64), (2,2,3,3), (2,2,4,4), ..., (2,2,64,64), (3,3,4,4), ..., (3,3,64,64), ...}.

A technique (proposed by Bose and Caldwell) for generating a cyclically permutable code from a cyclic block code (the RS code) is described in reference document [3]. Such techniques may as well be used as the foundation in the above code construction.

A benefit of the RCP code construction according to the present invention is that it imposes a structure to the codewords. A time repetitive structure, which will be utilized in the decoder for determining time shifts and to provide means for diversity combining of repeated symbols, is added to the code.

It should be noted that the concatenation of $$\left(c_1, c_2, \ldots, c_{\lceil \frac{M}{2} \rceil}, c_1, c_2, \ldots, c_{\lceil \frac{M}{2} \rceil}\right)$$

is a repetition code which would provide larger separation between the symbols and therefore larger time diversity, but this is not a cyclically permutable codeword. Such a code construction is therefore not suitable for synchronization and does thus not solve the stated problem.

The code constructions described above uses a repetition factor of 2, i.e. each element is repeated twice within the codeword. Larger repetition factors could, however, also be considered. Larger repetition factors would imply better diversity but would also decrease the number of codewords. Better diversity in the decoding is favorable, but to decrease the number of codewords is not desirable from a cell search perspective.

Throughout this description, exemplary embodiments of RCP codes according to the invention with repetition factor 2 are mainly described. The invention can however be generalized to more than two repetitions. This can for instance be done according to the following.

If we have a cyclically permutable code $c=(c_k)$ of length n, so that no codeword is a cyclic shift of another codeword and each codeword has unique cyclic shifts, the construction of codewords $\tilde{c}=(\tilde{c}_k)$ of length n·t can be done by t>1 consecutive repetitions of each codeword element $\tilde{c}_{tk-t+1}=\ldots=\tilde{c}_{tk}=c_k$, k=1, 2, ..., n.

This can also be done, having a cyclically permutable code with codewords $c=(c_k)$ of length n as a starting point, by constructing codewords $\tilde{c}=(\tilde{c}_k)$ of length (n−1)·t+1 by t>1 consecutive repetitions of n−1 codeword elements $\tilde{c}_{tk-t+1}=\ldots=\tilde{c}_{tk}=c_k$, k=1, 2, ..., n−1 and $\tilde{c}_{(n-1)·t+1}=c_n$.

There are, as is clear for a person skilled in the art, many ways of creating these RCP codes. The methods for creation of repetitive cyclically permutable codes given above are only a couple of exemplary embodiments of how this can be done. The general idea of the invention can be utilized in a number of ways. A skilled person realizes that the invention can be generalized to imposing any kind of repetitive structure to a cyclically permutable code.

As long as the repetitive structure is applied for all the codewords in the code, the decoding procedure according to the invention will reduce the complexity of the decoder. This differs from background art synchronization codes. In table 4 in reference document [1] it can be seen that for instance groups 15-21 do not contain repetitive codewords. The code defined in the 3GPP standard document does thus not have a repetitive structure for all codewords of the code. The code defined in table 4 in reference document [1] could thus not be used to reduce the decoding complexity according to the present invention.

Decoding

The decoding procedure will hereafter be described. The decoder shall determine the codeword and its cyclic shift. The decoding of the above RCP code utilizes the repetitive code structure of the code and is done in four steps that will be described hereafter. These four decoding steps are:

1. calculation of metrics corresponding to probabilities that a certain value was transmitted for an element in a codeword,
2. hypothesis testing and diversity combining,
3. codeword detection,
4. codeword verification.

Decoding Step 1: Metrics Calculation

For each received synchronization symbol, $1 \leq m \leq M$, the receiver computes for the possible SCH sequences/symbols $1 \leq k \leq N$ a metric $\rho_{km}$. This may, e.g., be the magnitude of a correlator output, or some other soft output of a decoder. A large value of $\rho_{km}$ should indicate that sequence k was transmitted in slot m with high probability. A graph of this correlator output for one slot has thus typically an amplitude peak for the symbol k that was transmitted and has considerably lower amplitude for other k.

As a numerical example, if a codeword (1,1,2,2) of length 4 (M=4) has been received, correlations are calculated for each of the four slots in order to estimate the probabilities for which symbol that was transmitted in each slot. This is done in order to estimate which symbols that were probably transmitted in each slot, in other words, which values the elements of the transmitted codeword probably have. For the codeword of this example, codeword (1,1,2,2), the graphs of the correlations $\rho_{km}$ for the first and second slots will have a peak for the value "1" whereas the graphs of the correlations for the third and fourth slots will have a peak for the value "2".

It may be noted that the correlation values $\rho_{km}$ may in turn be obtained as averages over several radio frames.

Decoding Step 2: Hypothesis Testing and Diversity Combining

The imposed repetitive structure of the code will, in this decoding step, be exploited in two ways:

to reduce the number of cyclic shifts to be evaluated,
to diversity combine decoder metrics of the elements that have the same values.

To determine which codeword elements that have the same values, that is to determine which codeword elements that can be diversity combined, the receiver evaluates a set of hypotheses.

As an example, hypothesis testing is here shown for the RCP code having a repetition factor 2 given above, created by, for M even:

$$\tilde{c}_{2k-1}=\tilde{c}_{2k}=c_k, k=1, 2, \ldots, M/2,$$

and for M odd:

$$\tilde{c}_{2k-1} = \tilde{c}_{2k} = c_k, \quad k = 1, 2, \ldots, \left\lceil \frac{M}{2} \right\rceil - 1,$$

$$\tilde{c}_M = c_{\lceil \frac{M}{2} \rceil}.$$

For even M, there are two such hypotheses for this particular code, $H_0$ and $H_1$. These hypotheses describe which consecutive elements of a received codeword $\tilde{r}=(\tilde{r}_i)$ that, according to each hypothesis, have the same values:

$H_0$: $(\tilde{r}_1=\tilde{r}_2)$ & $(\tilde{r}_3=\tilde{r}_4)$ & ... & $(\tilde{r}_{M-1}=\tilde{r}_m)$
$H_1$: $(\tilde{r}_2=\tilde{r}_3)$ & $(\tilde{r}_4=\tilde{r}_5)$ & ... & $(\tilde{r}_M=\tilde{r}_1)$ Associated with each hypothesis, are M/2 sets, containing the indices to symbols that can be combined, that is codeword elements that can be diversity combined if the hypothesis is correct.

Having evaluated $H_0$ and $H_1$ and chosen one of them, say $H_0$, as the correct one, the metrics of the codeword elements are diversity combined according to the sets of $H_0$. How to generally evaluate hypotheses is mathematically described in more detail later in this section.

For codewords of the length M, where M is odd, a cyclic shift results in that the Mth codeword element can appear at M positions, thus there are M hypotheses to evaluate.

If there are as many possible cyclic shifts of a codeword as there are hypotheses, the correct hypothesis determines both the elements that could be combined and the actual frame timing. Hence no further cyclic shifts would need to be evaluated for detecting the cell ID. Since the hypothesis testing does not include any cell ID detection, it would in this case mean that, frame timing can be obtained before and without having to determine the cell ID. It can be observed that in the special case of M being odd and all codewords have the property $\tilde{c}_M \neq \tilde{c}_1$ & $\tilde{c}_M \neq \tilde{c}_{M-1}$, there are as many possible cyclic shifts of the codewords as there are hypotheses, see the following example.

Analysis of a codeword (1,1,2,2,3) and its cyclic shifts (3,1,1,2,2), (2,3,1,1,2), (2,2,3,1,1) and (1,2,2,3,1), reveals that each of these shifts corresponds to one hypothesis each, i.e., in total 5 hypotheses.

$H_0$: $(\tilde{r}_1=\tilde{r}_2)$ & $(\tilde{r}_3=\tilde{r}_4)$
$H_1$: $(\tilde{r}_2=\tilde{r}_3)$ & $(\tilde{r}_4=\tilde{r}_5)$
$H_2$: $(\tilde{r}_1=\tilde{r}_5)$ & $(\tilde{r}_3=\tilde{r}_4)$
$H_3$: $(\tilde{r}_1=\tilde{r}_2)$ & $(\tilde{r}_4=\tilde{r}_5)$
$H_4$: $(\tilde{r}_1=\tilde{r}_5)$ & $(\tilde{r}_2=\tilde{r}_3)$ Clearly, since all of the 5 cyclic shifts belong to different hypotheses, the correct hypothesis determines which elements to combine and, additionally, also the actual frame timing.

If a codeword (1,1,2,2,2) and its cyclic shifts (2,1,1,2,2), (2,2,1,1,2), (2,2,2,1,1) and (1,2,2,2,1) are analyzed by testing the hypotheses $H_0$-$H_4$ defined above, it is possible to determine which two elements to diversity combine with each other. But, the frame timing may not be obtained directly from the correct hypothesis because more than one codeword is true under each hypothesis, e.g., both (1,1,2,2,2) and (2,2,1,1,2) are true under $H_0$, both (2,1,1,2,2) and (2,2,2,1,1) are true under H1, etc.

The hypothesis testing and diversity combining procedures will now be described mathematically.

According to the invention, hypotheses should be evaluated and diversity combining should be performed by calculating, for each hypothesis h and its associated index sets $R_{hj}$, for all j:

$$D_{kj}(h) = \sum_{m \in R_{hj}} \rho_{km}, \quad (1)$$

and choose the hypothesis $H_x$, for which $$x = \underset{h}{\operatorname{argmax}} \sum_{j} \max_{k} D_{kj}(h), \quad (2)$$

where $\rho_{km}$ relates to the probability that sequence k was transmitted in slot m and $R_{hj}$ are index sets indicating sets of codeword elements under hypothesis h having the same value.

In equation 1, the diversity combining of the metrics is done according to the timing which the hypothesis defines, that is diversity combining is here performed in accordance with the hypothesis.

By the hypothesis testing and diversity combining in decoding step 2 according to the invention, the decoder has both narrowed down the possible cyclic shifts and computed new metrics $D_{kj}$ by diversity combining. Less complex computation in the following decoding steps, compared to background art methods, can therefore be achieved.

In an illustrative numerical example for a code with M=4, the codeword (1,1,2,2) and its cyclic shifts (2,1,1,2), (2,2,1,1) and (1,2,2,1) can be considered. For determining which codeword element correlations to diversity combine, out of the in total 4 codeword elements, two hypotheses are tested:

$H_0$: $(\tilde{r}_1=\tilde{r}_2)$ & $(\tilde{r}_3=\tilde{r}_4)$
$H_1$: $(\tilde{r}_1=\tilde{r}_4)$ & $(\tilde{r}_2=\tilde{r}_3)$ The codewords (1,1,2,2) and (2,2,1,1) are captured under $H_0$, and the other two under $H_1$. Index sets associated with hypothesis $H_0$ can be defined as $R_{01}=\{1,2\}$ and $R_{02}=\{3,4\}$. These index sets here correspond to the codeword elements that, according to hypothesis $H_0$, have the same values and therefore also should be diversely combined. The first and the second codeword element have the same values in $H_0$ and the third and the fourth codeword elements also have the same value, index sets $R_{01}=\{1,2\}$ and $R_{02}=\{3,4\}$ can therefore be derived. For hypothesis $H_1$, index sets $R_{11}=\{1,4\}$ and $R_{12}=\{2,3\}$ can be defined in the same way. At this step of hypothesis testing it is not necessary to decode any codeword, only a correct hypothesis is sought. Once the hypothesis is detected ($H_0$ or $H_1$), the correlations are diversity combined according to the detected hypothesis, and decoding of cell ID starts. Note that the frame timing is not directly obtained once the correct hypothesis is determined, there are still a number of codewords that belong to the same hypothesis, e.g. (1,1,2,2) and (2,2,1,1) for $H_0$, and frame timing is obtained first when one of theses codewords belonging to the hypothesis is chosen as the transmitted codeword.

As previously noted in the numerical example in decoding step 1 (metrics calculation) above, the graphs of the correlations $\rho_{km}$ for the codeword (1,1,2,2) will have a peak for the value "1" in the first and second slots whereas the graphs of the correlations $\rho_{km}$ for the third and fourth slots will have a peak for the value "2".

If these peaks all have amplitude=1, a reception of the codeword (1,1,2,2) would result in $\rho_{11}=\rho_{12}=\rho_{23}=\rho_{24}=1$ (amplitude) and all other $\rho_{km}=0$ (amplitude). Equation 1 above then adds these correlation vectors together according to the index sets corresponding to the two hypotheses, that is for $H_0$ index sets $R_{01}=\{1,2\}$ and $R_{02}=\{3,4\}$ are used and for hypothesis $H_1$ index sets $R_{11}=\{1,4\}$ and $R_{12}=\{2,3\}$ are used.

For $H_0$, the correlations for the index set $R_{01}=\{1,2\}$ are first summed for the received codeword (1,1,2,2). Both first and second elements of the codeword have the value "1". $\rho_{km}$ for both the first and the second element thus have a peak for value "1" and these the correlations $\rho_{km}$ are summed together to a big peak for the value "1". This peak has an amplitude=2, since $\rho_{11}=\rho_{12}=1$. The graph of $D_{kj}(0)$ in equation 1 will thus be a correlation graph having a peak of amplitude=2 for the value "1" and amplitude zero for the rest of the values. Then the correlations for the index set $R_{02}=\{3,4\}$ are also summed for the received codeword (1,1,2,2). Since both third and fourth elements of the codeword have the value "2", the correlations are added together to a big peak for the value "2", this peak having an amplitude=2. The graph of $D_{kj}(0)$ in equation 1 will thus be a correlation graph having a peak of amplitude 2 for the value "2" and amplitude zero for the rest of the values.

For hypothesis $H_0$, equation 2 then searches for the maximum values of $D_{kj}(0)$ corresponding to $R_{01}$ and $R_{02}$ and adds these maximum values together. This results in $$\sum_j \max_k D_{kj}(0) = 4,$$

since both $D_{kj}(0)$ corresponding to $R_{01}$ and $D_{kj}(0)$ corresponding to $R_{02}$ have a peak amplitude=2.

If the same procedure is performed for hypothesis $H_1$ for the codeword (1,1,2,2), the summations of correlations $\rho_{km}$ according to hypothesis $H_1$ using index sets $R_{11}=\{1,4\}$ and $R_{12}=\{2,3\}$ in equation 1 will result in $D_{kj}(1)$ having two peaks of amplitude 1. For example, addition according to index set $R_{11}=\{1,4\}$ adds the first and the fourth codeword element. The correlation curves $\rho_{km}$ for the first and fourth element have peaks in different positions since the elements have different values, the curve for the first element has a peak for the position of value "1" and the curve for the fourth element has a peak for the position of value "2". When these correlations are added together the graph of the summation thus has two peaks of amplitude 1, one for value "1" and one for value "2".

For hypothesis $H_1$, equation 2 then searches for the maximum values of $D_{kj}(1)$ corresponding to $R_{11}$ and $R_{12}$ and adds these maximum values together. This results in $$\sum_j D_{kj}(1) = 2,$$

since both $D_{kj}(1)$ corresponding to $R_{11}$ and $D_{kj}(1)$ corresponding $R_{12}$ have a maximum amplitude=1.

Thus, using the hypotheses $H_0$ and $H_1$ defined above in this example, it follows that $$\sum_j \max_k D_{kj}(0) = 4$$

for $H_0$ and $$\sum_j D_{kj}(1) = 2$$

for $H_1$. This shows that, the energy of all the symbols are added under hypothesis $H_0$, whereas under the wrong hypothesis ($H_1$) only the energy of one symbol per index set is captured. A larger value is therefore obtained for hypothesis $H_0$ here, since $H_0$ is the correct hypothesis. This can be used for selecting hypothesis, simply by choosing the hypothesis rendering the largest value of $D_{kj}$.

Decoding Step 3: Codeword Detection

In the codeword detection step, the codeword elements can be determined in at least two different ways. One way of detecting the elements is new for the present invention and one way is derived from maximum likelihood criterion.

First the new detection method is presented. According to this detection method the detection is performed as:

for the chosen hypothesis $H_x$, for all j, and $p \in R_{xj}$, let the detected codeword $s=(s_p)$ be:

$$s_p = \arg\max_k D_{kj}(x). \quad (3)$$

This procedure allocates the codeword elements from the diversity combined metrics $D_{kj}(x)$.

The computed metrics $D_{kj}$ from equation 1 are reused in equation 3 for codeword decoding, which is performed by a single maximization operation. If the hypothesis test in decoding step 2 is accurate, metrics have already been correctly combined in decoding step 2 and the maximization step in equation 3 should assure good performance.

Since the number of tested hypotheses in general is much lower than the number of codewords and their cyclic shifts, less metric computations are foreseen and a lower decoding complexity can be maintained. In comparison, the maximum likelihood scheme in reference document [3], computes one metric $$\sum_{i=1}^{M} \rho_{\tilde{c}_i i}$$

for each codeword $(\tilde{c}_1, \tilde{c}_2, \ldots, \tilde{c}_M)$ and each cyclic shift thereof and then compares all of them to get the maximum one.

It is noted that in the above method described in decoding steps 1-3, after the choice of hypothesis, the number of remaining and eligible cyclic shifts of the codewords has been reduced, only those under the chosen Hx remain. For the exemplary code described above, for even M, the number of time shifts has been reduced by 2 and for odd M it is reduced by a factor M.

As mentioned above, a method derived from a maximum likelihood criterion can also be used for codeword detection in decoding step 3. Codeword detection according to this method is, for the chosen hypothesis Hx and all codewords $\tilde{c} \in \Phi$, where the set $\Phi$ contains the codewords and cyclic shifts thereof that may be true under Hx, performed as:

$$s = \underset{\tilde{c} \in \Phi}{\mathrm{argmax}} \sum_{i=1}^{M} \rho_{\tilde{c}_i i}, \quad (4)$$

where s is the detected codeword.

It should be noted that, if this maximum likelihood criterion is used for the present invention, it still differs from pure maximum likelihood methods as the one shown in reference document [3]. According to this invention decoding steps 1 and 2 are first performed according to the invention and the maximum likelihood criterion is only used in decoding step 3. That is, only time shifts under the chosen hypothesis are evaluated in the method. In pure maximum likelihood methods as the one described in reference document [3], all codewords and all cyclic shifts thereof are evaluated, not only the ones under the chosen hypothesis as in the present invention.

Decoding Step 4: Codeword Verification

Finally it is verified whether the resulting codeword ($s_1$, $s_2$, ..., $s_M$) is a valid cyclically shifted codeword. This is done by comparing it to all possible codewords and cyclic shifts of codewords under the chosen hypothesis. If the detected codeword is a valid codeword, the frame timing and cell ID is determined correctly. If it is not, a decoding error should be declared.

It should be noted that the calculations in this step are also reduced by the present invention since the detected codeword only has to be compared to possible codewords and cyclic shifts of codewords under the chosen hypothesis and not to all possible codewords and cyclic shifts of codewords.

Figure 2:
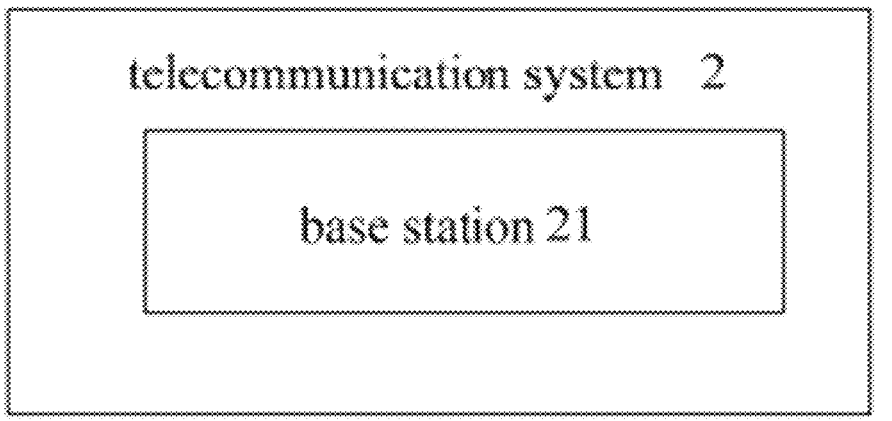
FIG. 2 shows a base station in a telecommunication system according to an embodiment of the present invention.

FIG. 2 shows a base station 21 in a telecommunication system 2 according to an embodiment of the present invention. The base station 21 is adapted to encode data and synchronization information with a code having codewords ($\tilde{c}_1$, $\tilde{c}_2$, ..., $\tilde{c}_M$) of length M so that no codeword is a cyclic shift of another codeword and each codeword has M distinct unique cyclic shifts, M being a positive integer, wherein the base station 21 is adapted to create the code by repeating, in each codeword, the value of at least one codeword element $\tilde{c}_k$ of the codeword in at least one other codeword element position within the same codeword, thereby giving all codewords in the code a repetitive structure.

Figure 3:
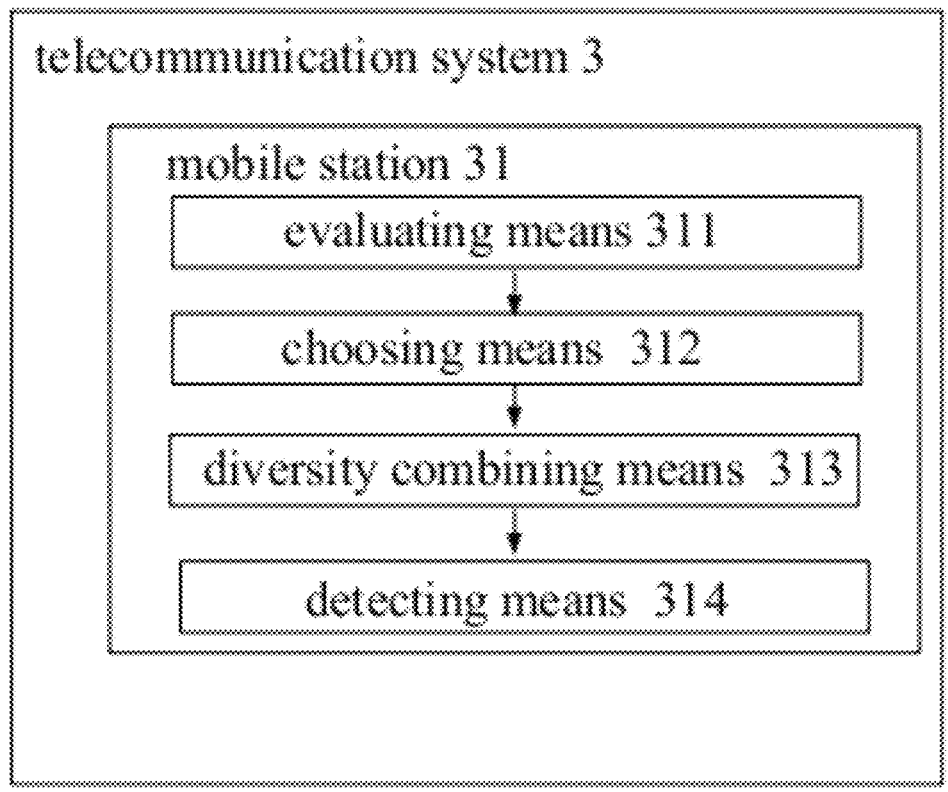
FIG. 3 shows a mobile station in a telecommunication system according to an embodiment of the present invention.

FIG. 3 shows a mobile station 31 in a telecommunication system 3 according to an embodiment. The mobile station 31 includes an evaluating means 311, a choosing means 312, a diversity means 313 and a detecting means 314. The evaluating means 311 is adapted to evaluate, by use of hypotheses Hx, the repetitive codeword structure of received codewords. The choosing means 312 is adapted to choose a hypothesis corresponding to the repetitive codeword structure. The diversity combining means 313 is adapted to diversity-combine codeword elements of the codewords in accordance with the chosen hypothesis. The detecting means 314 is adapted to detect the received codewords by comparing the diversity combined codeword elements to all possible codewords fulfilling the hypothesis. The evaluating means, choosing means, diversity means and detecting means can be performed in software, or in hardware which can read and execute instructions in the form of software.

The above mentioned methods of encoding data and synchronization information and methods of detecting/decoding data and synchronization information may be executed by a processor in the base station and/or mobile station by reading and running software code, or by an apparatus in the base station and/or mobile station comprising such processor.

Performance Evaluation

The whole decoding procedure has now been presented. In the following sections the performance and the complexity of the present invention is described.

The present invention achieves reductions in decoding complexity. Decoding complexity is analysed in terms of number of operations per decoded codeword, assuming a repetition factor of 2, for the exemplary code given above.

For the RCP code according to the invention in decoding step 1 and 2, there will be N·M/2·H [elements/index set*index sets*hypotheses] additions of correlation values where H is the number of hypotheses (H=2 for M even, and H=M for M odd). So the number of computations is linear or quadratic in the code length M, linear in the sequence space N but, importantly, for a given N and M, independent of the number of codewords of the code. In decoding step 3, the maximum operator is applied M/2 times on a vector of length N.

As a comparison, for completing a pure maximum likelihood decoding, according to for example reference document [3], all codewords and cyclic shifts are evaluated according to $$\sum_{i=1}^{M} \rho_{\tilde{c}_i i}.$$

If the code has W codewords, there will in total be W·M² [codewords*elements/codeword*cyclic shifts] additions of correlation values, where the square on M accounts for the cyclic shifts. So the number of computations is always quadratic in the code length M, linear in the number of codewords but independent of the sequence space N. The final maximum operator is applied 1 time to a vector of length W·M.

Thus, the proposed RCP code according to the present invention will reduce the decoding complexity in the correlation computations and maximization operations for codes with large amount of codewords (W>>N) and/or long code lengths. For even M, the decoding complexity reduction is a factor MW/N and for odd M, a factor 2W/N. Thus the RCP code is suitable to, e.g., non-hierarchical cell search, where a larger number of codewords must be handled.

In FIG. 1, the code described above in the section of code construction, having the set of codewords: {(1,1,2,2), (1,1,3,3), ..., (1,1,64,64), (2,2,3,3), (2,2,4,4), ..., (2,2,64,64), (3,3,4,4), ..., (3,3,64,64), ... }, has been numerically evaluated.

From the code, 1024 codewords have been selected. Simulations are done in an OFDM simulator, following the working assumptions of E-UTRA. The synchronization sequences and the detector are described further in reference document [9]. The error probabilities of three decoding methods are plotted;
1) Maximum likelihood (ML) detection (optimal).
2) The proposed method of the present invention.
3) A method which decodes each codeword element independently, $$s_m = \underset{k}{\mathrm{argmax}}\, \rho_{km},$$

not using any diversity combining.

Method 3 can be regarded as a method not offering any coding gain, as the elements are decoded individually. For methods 2 and 3, an error event is counted also if a decoding error is declared.

It can be seen that the proposed method 2 is close to the optimal ML method within a fraction of one dB. The loss of not using the inherent diversity structure in the code is shown by the much worse performance of the last method, method 3. Hence the suggested method 2 is expected to not significantly increase the cell search time, while having a much simpler decoding procedure than ML.

In the ML decoding according to method 1, the correct codeword is found if its metric is larger than those of all the other codewords. Hence, increasing the number of codewords, the error probability will become worse, as more erroneous codeword candidates need to be compared. The same effect occurs for ML decoding if M increases, as there are then more cyclic shifts to consider.

Therefore, the performance gain of ML over the proposed decoding algorithm of the present invention will decrease as the number of codewords becomes larger. Thus the RCP code is suitable to e.g., a non-hierarchical cell search, where a larger number of codewords must be coped with.

The invention can further be used in all applications where the synchronization signals, transmitted to support and alleviate the timing acquisition in the receiver, also carry some information, such as an identification number of a transmitter etc. One such application is the cell search procedure in the cellular systems. A skilled person realizes that there are more such applications for the invention.

The given synchronization code of the invention, can be used in both non-hierarchical and hierarchical synchronization channels. The invention is also not restricted to OFDM signals, it can be used for all kinds of telecommunication systems as is clear to a skilled person.

The repetitive code structure may also be utilized in the channel estimation and can further be used in other signalling in a telecommunication system.

The code creation and decoding according to the invention may be modified by those skilled in the art, as compared to the exemplary embodiments described above.

REFERENCE DOCUMENTS

Each of the following documents referenced hereinabove is hereby incorporated by reference in its entirety.

[1] 3GPP TS 25.213 v7.0.0, "Spreading and modulation (FDD)", March 2006
[2] Y. P. E. Wang and T. Ottosson, "Cell Search in W-CDMA", *IEEE J. Sel. Areas Commun.*, vol. 18, pp. 1470-1482, August 2000.
[3] S. Sriram and S. Hosur, "Cyclically Permutable Codes for Rapid Acquisition in DS-CDMA Systems with Asynchronous Base Stations", *IEEE J. Sel. Areas Commun.*, vol. 19, pp. 83-94, January 2000.
[4] M. Tanda, "Blind Symbol-Timing and Frequency-Offset Estimation in OFDM Systems with Real Data Symbols," *IEEE Trans. Commun.*, vol. 52, pp. 1609-1612, October 2004.
[5] B. M. Popovic, "Synchronization signals for timing acquisition and information transmission", PCT/CN2006/000076, Huawei, 2006.
[6] T. M. Schmidl and D. C. Cox, "Robust Frequency and Timing Synchronization for OFDM", *IEEE Trans. Commun.*, vol.45, pp. 1613-1621, December 1997.
[7] ETRI, "Cell Search Scheme for EUTRA", R1-060823, Athens, Greece, Mar. 27-31, 2006.
[8] Huawei, "Additional Link-level Evaluation of Cell Search Times for Non-hierarchical and Hierarchical SCH Signals", R1-061817, Cannes, France, June 27-30, 2006.
[9] Huawei, "Cell Search Times of Hierarchical and Non-hierarchical SCH Signals", R1-061248, Shanghai, China, May 8-12, 2006.
[10] Huawei, "System-level Evaluation of Cell Search Times for Non-hierarchical and Hierarchical SCH Signals", R1-061818, Cannes, France, June 27-30, 2006.

What is claimed is:

1. A method of encoding cell-specific information in a telecommunication system, comprising:
   encoding cell-specific information by a synchronization code; and
   sending a synchronization signal comprising the synchronization code, wherein the synchronization code comprises a first repetitive cyclically permutable codeword generated from a first codeword $$\left(c_1, c_2, \ldots c_i \ldots, c_{\lceil \frac{M}{2} \rceil}\right),$$

where $$\left\lceil \frac{M}{2} \right\rceil$$

is the smallest integer not less than M/2, $0 \leq c_i \leq N$, $1 \leq i \leq M$ for all i, M, N are positive integers, and the repetitive structure of the first repetitive cyclically permutable codeword is given by repeating the value of at least one codeword element of the first repetitive cyclically permutable codeword in at least one other codeword element position within the first repetitive cyclically permutable codeword.

2. The method according to claim 1, wherein the first repetitive cyclically permutable codeword has a plurality of distinct, unique cyclic shifts.

3. The method according to claim 1, wherein the synchronization code further comprises a second repetitive cyclically permutable codeword generated from the first codeword, the second repetitive cyclically permutable codeword having a plurality of distinct unique cyclic shifts, and the second repetitive cyclically permutable codeword is not a cyclic shift of the first repetitive cyclically permutable codeword.

4. The method according to claim 1, wherein the synchronization code comprises a set of repetitive cyclically permutable codewords generated from the first codeword, each repetitive cyclically permutable codeword in the set having a plurality of distinct, unique cyclic shifts, and no repetitive cyclically permutable codeword in the set is a cyclic shift of another repetitive cyclically permutable codeword in the set.

5. The method according to claim 1, wherein the cell-specific information comprises one or any combination of the following: a cell ID, a channel bandwidth, the number of antennas, and a cyclic prefix length.

6. The method according to claim 1, wherein the synchronization code provides for frame timing synchronization.

7. The method according to claim 1, wherein the first repetitive cyclically permutable codeword is $(\tilde{c}_1, \tilde{c}_2, \ldots, \tilde{c}_M)$, and for M as an even number, the first repetitive cyclically permutable codeword is generated by:

$$\tilde{c}_{2k-1} = \tilde{c}_{2k} = c_k, k=1, 2, \ldots, M/2,$$

and, for M as an odd number, the first repetitive cyclically permutable codeword is generated by:

$$\tilde{c}_{2k-1} = \tilde{c}_{2k} = c_k, \quad k = 1, 2, \ldots, \left\lceil \frac{M}{2} \right\rceil - 1, \tilde{c}_M = c_{\lceil \frac{M}{2} \rceil}.$$

8. The method according to claim 1, wherein M=4, and the first codeword is $(c_1, c_2)$.

9. The method according to claim 8, wherein the first repetitive cyclically permutable codeword has M=4 distinct unique cyclic shifts as follows:

$(c_2, c_1, c_1, c_2), (c_2, c_2, c_1, c_1), (c_1, c_2, c_2, c_1)$ and $(c_1, c_1, c_2, c_2)$ 10. An apparatus in a telecommunication system, comprising a processor configured to:
 encode cell-specific information by a synchronization code; and
 send a synchronization signal comprising the synchronization code, wherein the synchronization code comprises a first repetitive cyclically permutable codeword generated from a first codeword $$\left( c_1, c_2, \ldots c_i \ldots, c_{\lceil \frac{M}{2} \rceil} \right),$$

where $$\left\lceil \frac{M}{2} \right\rceil$$

is the smallest integer not less than M/2, $0 \leq c_i \leq N$, $1 \leq i \leq M$ for all i, M, N are positive integers, and the repetitive structure of the first repetitive cyclically permutable codeword is given by repeating the value of at least one codeword element of the first repetitive cyclically permutable codeword in at least one other codeword element position within the first repetitive cyclically permutable codeword.

11. A method of detecting cell-specific information in a telecommunication system, comprising:
 receiving a synchronization signal comprising a synchronization code; and
 detecting cell-specific information by decoding the synchronization code, wherein the synchronization code comprises a first repetitive cyclically permutable codeword generated from a first codeword $$\left( c_1, c_2, \ldots c_i \ldots, c_{\lceil \frac{M}{2} \rceil} \right),$$

where $$\left\lceil \frac{M}{2} \right\rceil$$

is the smallest integer not less than M/2, $0 \leq c_i \leq N$, $1 \leq i \leq M$ for all i, M, N are positive integers, and the repetitive structure of the first repetitive cyclically permutable codeword is given by repeating the value of at least one codeword element of the first repetitive cyclically permutable codeword in at least one other codeword element position within the first repetitive cyclically permutable codeword.

12. The method according to claim 11, wherein the first repetitive cyclically permutable codeword has a plurality of distinct unique cyclic shifts.

13. The method according to claim 11, wherein the synchronization code further comprises a second repetitive cyclically permutable codeword generated from the first codeword, the second repetitive cyclically permutable codeword has a plurality of distinct unique cyclic shifts, and the second repetitive cyclically permutable codeword is not a cyclic shift of the first repetitive cyclically permutable codeword.

14. The method according to claim 11, wherein the synchronization code comprises a set of repetitive cyclically permutable codewords generated from the first codeword, each repetitive cyclically permutable codeword in the set having a plurality of distinct unique cyclic shifts, and no repetitive cyclically permutable codeword in the set is a cyclic shift of another repetitive cyclically permutable codeword in the set.

15. The method according to claim 11, wherein the cell-specific information comprises one or any combination of the following: a cell ID, a channel bandwidth, the number of antennas, and a cyclic prefix length.

16. The method according to claim 11, wherein the synchronization code provides for frame timing synchronization.

17. The method according to claim 11, wherein the first repetitive cyclically permutable codeword is $(\tilde{c}_1, \tilde{c}_2, \ldots, \tilde{c}_M)$, and for M as an even number, the first repetitive cyclically permutable codeword is generated by:

$$\tilde{c}_{2k-1} = \tilde{c}_{2k} = c_k, k=1, 2, \ldots, M/2,$$

and, for M as an odd number, the first repetitive cyclically permutable codeword is generated by:

$$\tilde{c}_{2k-1} = \tilde{c}_{2k} = c_k, k = 1, 2, \ldots, \left\lceil \frac{M}{2} \right\rceil - 1, \tilde{c}_M = c_{\lceil \frac{M}{2} \rceil}.$$

18. The method according to claim 11, wherein M=4 and the first codeword is $(c_1, c_2)$.

19. The method according to claim 18, wherein the first repetitive cyclically permutable codeword has M=4 distinct unique cyclic shifts as follows:

$(c_2, c_1, c_1, c_2), (c_2, c_2, c_1, c_1), (c_1, c_2, c_2, c_1)$ and $(c_1, c_1, c_2, c_2)$.

20. An apparatus in a telecommunication system, comprising a processor configured to:
 receive a synchronization signal comprising a synchronization code; and
 detect cell-specific information by decoding the synchronization code, wherein the synchronization code comprises a first repetitive cyclically permutable codeword generated from a first codeword $$\left( c_1, c_2, \ldots c_i \ldots, c_{\lceil \frac{M}{2} \rceil} \right),$$

where $$\left\lceil \frac{M}{2} \right\rceil$$

is the smallest integer not less than M/2, $0 \leq c_i \leq N$, $1 \leq i \leq M$ for all i, M, N are positive integers, and the repetitive structure of the first repetitive cyclically permutable codeword is given by repeating the value of at least one codeword element of the first repetitive cyclically permutable codeword in at least one other codeword element position within the first repetitive cyclically permutable codeword.

* * * * *